US006956515B2

(12) United States Patent　　(10) Patent No.:　　US 6,956,515 B2
Keehr et al.　　(45) Date of Patent:　　Oct. 18, 2005

(54) DIGITAL TO ANALOG CONVERTER AUGMENTED WITH DIRECT CHARGE TRANSFER TECHNIQUES

(75) Inventors: Edward A. Keehr, San Diego, CA (US); Sean Wang, San Diego, CA (US); Seyfollah Bazarjani, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 10/463,969

(22) Filed: Jun. 17, 2003

(65) Prior Publication Data

US 2004/0070528 A1 Apr. 15, 2004

Related U.S. Application Data

(60) Provisional application No. 60/392,363, filed on Jun. 27, 2002.

(51) Int. Cl.$^7$ ............................. H03M 1/66; H03M 1/06
(52) U.S. Cl. ........................................ 341/150; 341/118
(58) Field of Search ................................. 341/150, 122, 341/143, 144, 146, 118, 120, 172; 250/214 R; 327/553; 330/107; 333/167; 348/308

(56) References Cited

U.S. PATENT DOCUMENTS

| 4,599,573 | A | | 7/1986 | Senderowicz | ............... 330/107 |
|---|---|---|---|---|---|
| 5,184,127 | A | * | 2/1993 | Myers | ........................ 341/122 |
| 5,495,200 | A | * | 2/1996 | Kwan et al. | ................ 327/553 |
| 5,798,724 | A | * | 8/1998 | Myers | ........................ 341/146 |
| 6,011,501 | A | * | 1/2000 | Gong et al. | ................. 341/150 |
| 6,215,431 | B1 | * | 4/2001 | Sheng et al. | ................ 341/144 |
| 6,271,784 | B1 | * | 8/2001 | Lynn et al. | ................. 341/150 |
| 6,340,940 | B1 | * | 1/2002 | Melanson | .................... 341/143 |
| 6,507,303 | B1 | * | 1/2003 | Alelyunas et al. | .......... 341/144 |
| 6,642,501 | B2 | * | 11/2003 | Mizuno et al. | ......... 250/214 R |
| 6,734,759 | B2 | * | 5/2004 | Humann | ..................... 333/167 |
| 6,734,908 | B1 | * | 5/2004 | Watanabe et al. | ........... 348/308 |
| 6,784,816 | B2 | * | 8/2004 | Melanson et al. | .......... 341/143 |
| 6,803,869 | B1 | * | 10/2004 | Melanson et al. | .......... 341/143 |

FOREIGN PATENT DOCUMENTS

| EP | 0967719 | | 12/1999 |
|---|---|---|---|
| EP | 1385268 | * | 1/2004 |

OTHER PUBLICATIONS

Nagaraj K et al.: "Switched–capacitor circuits with reduced sensitivity to amplifier gain" IEEE Transaction on Circuits and Systems, May 1987, USA, vol. CAS–34, No. 5, pp. 571–574, XP002258353.

Dessouky M., et al.: Very low–voltage fully differential amplifier for switched–capacitor applications: 2000 IEEE International Symposium on Circuits and Systems. Emerging Technologies for the 21$^{st}$ Century. Proceedings (IEEE Cat No. 00CH36353), ISACS 2000 Geneva. 2000 IEEE International Symposium on Circuits and Systems. Emerging Technologies for the 21, pp. 441–444, vol. 5 EX 002282739, May 28–31, 2000.

* cited by examiner

*Primary Examiner*—Patrick Wamsley
(74) *Attorney, Agent, or Firm*—Philip R. Wadswort; Charles D. Brown; Howard H. Seo

(57) ABSTRACT

A digital to analog converter augmented with Direct Charge Transfer (DCT) techniques. A digital to analog converter augmented with DCT and CDS techniques. A digital to analog converter augmented with Postfilter Droop Compensation.

35 Claims, 14 Drawing Sheets

BLOCK DIAGRAM OF PROPOSED DIGITAL-TO-ANALOG CONVERTER CHAIN

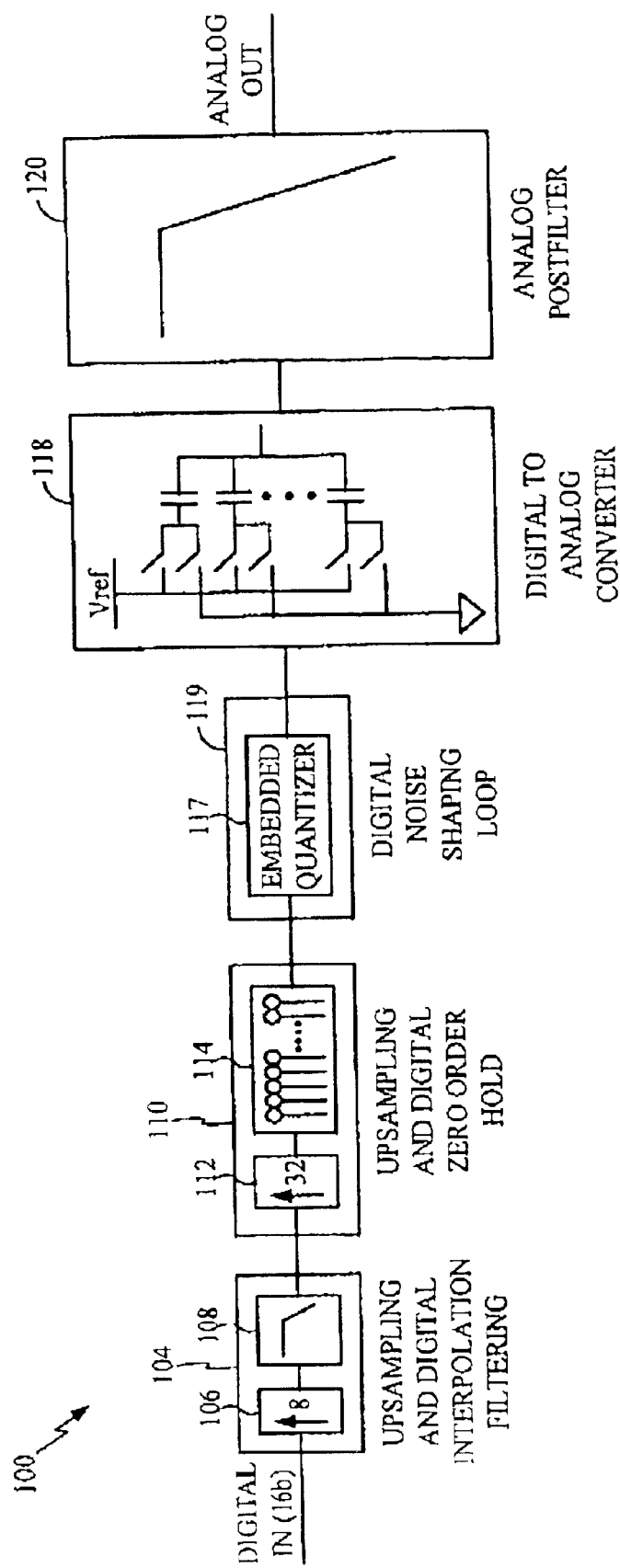
FIG. 1: BLOCK DIAGRAM OF OVERSAMPLED DIGITAL-TO-ANALOG CONVERTER
(PRIOR ART)

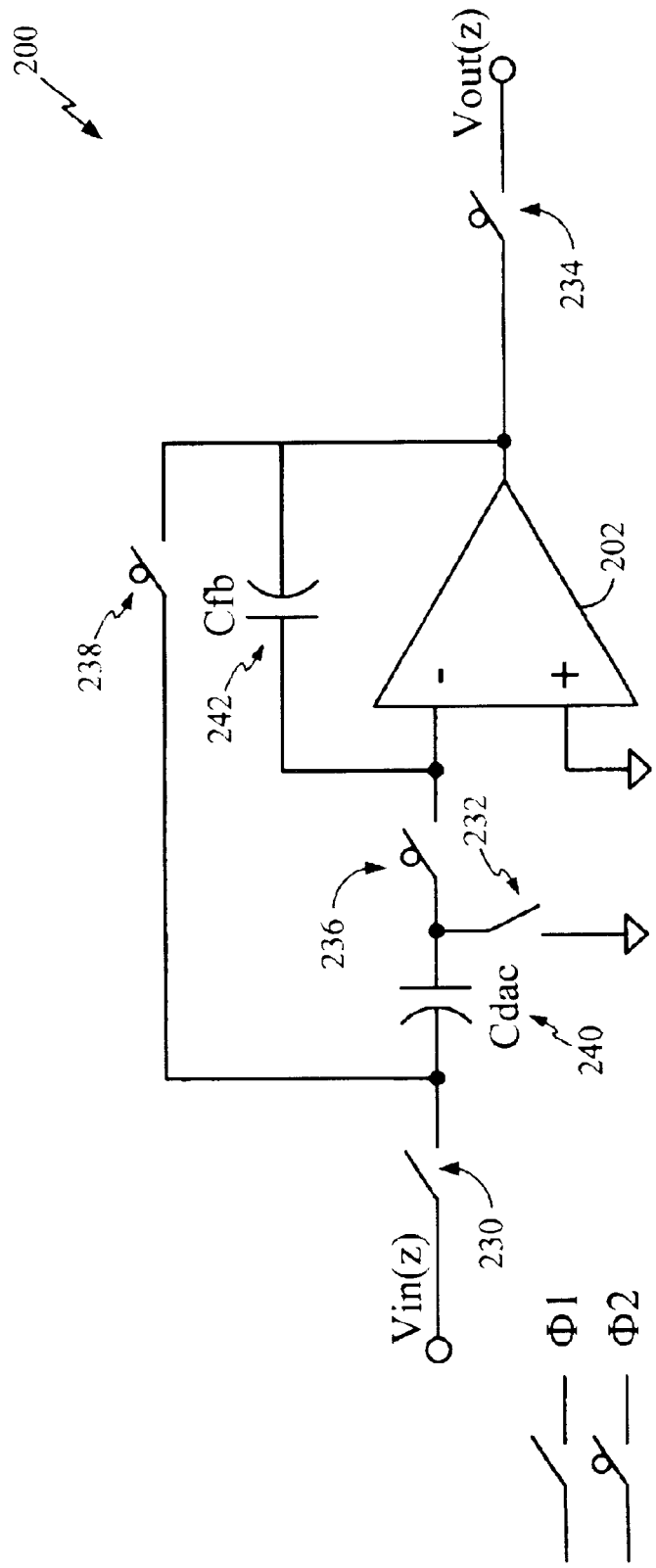
FIG. 2A: DIRECT CHARGE TRANSFER FILTER BLOCK

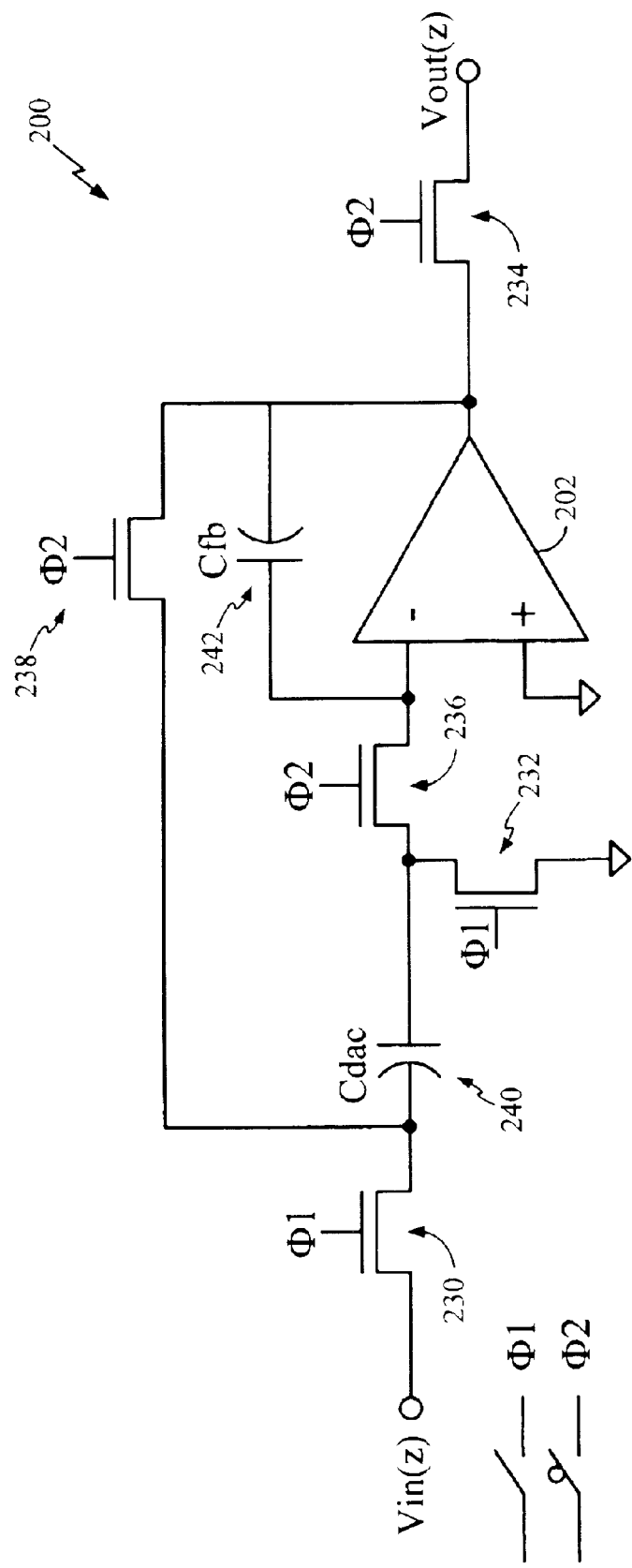
FIG. 2B: DIRECT CHARGE TRANSFER FILTER BLOCK

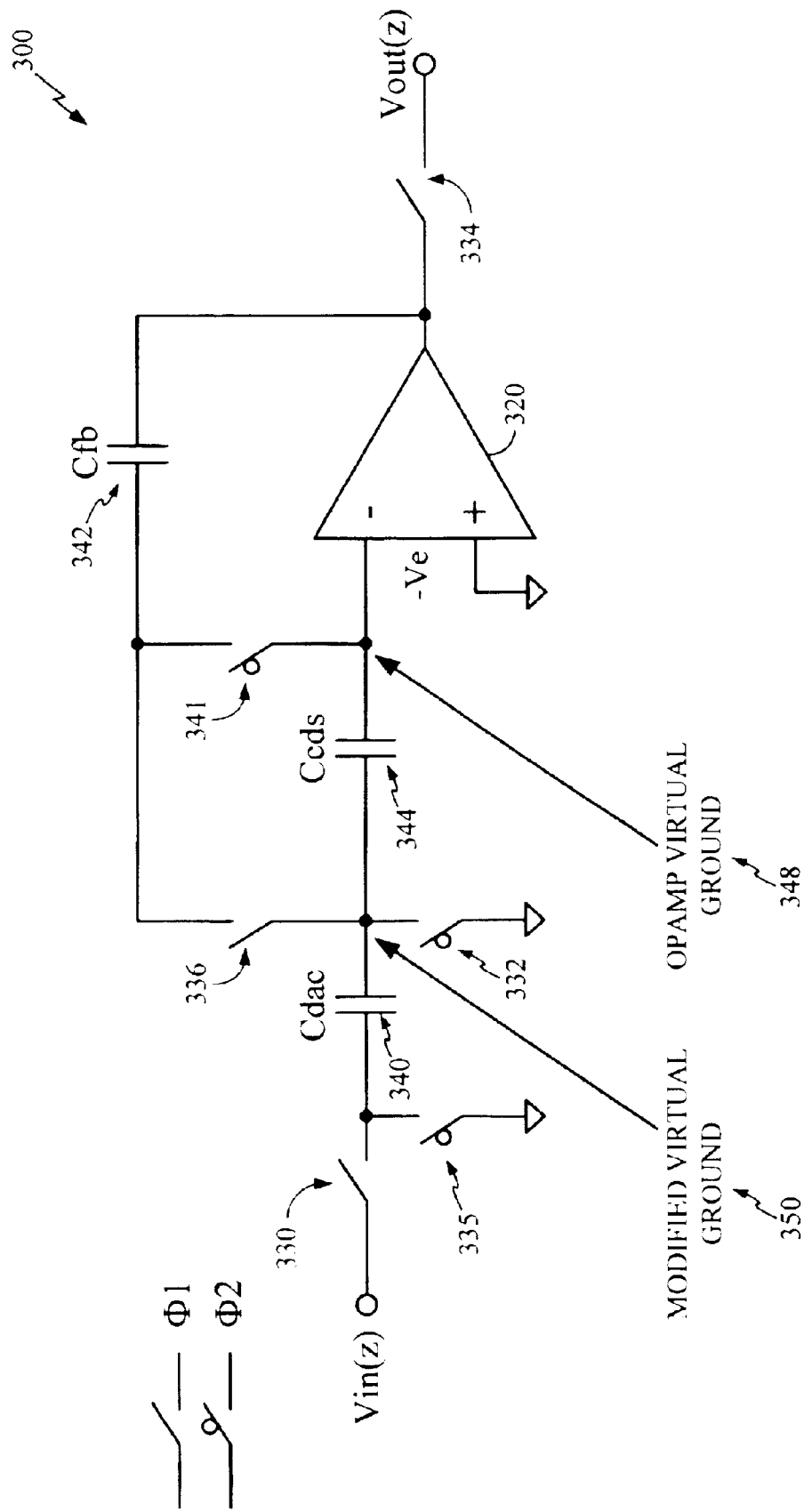
FIG. 3A: CORRELATED DOUBLE SAMPLING TECHNIQUE

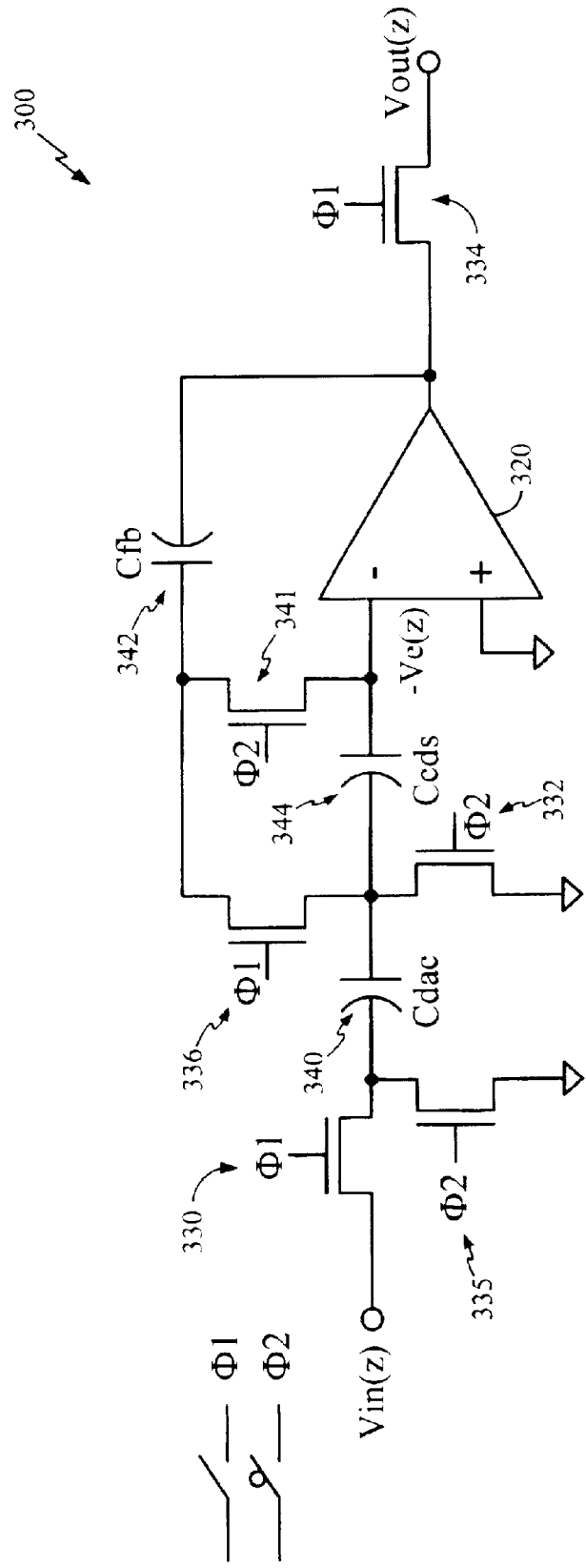
FIG. 3B: CORRELATED DOUBLE SAMPLING FOR A SWITCHED-CAPACITOR INTEGRATOR

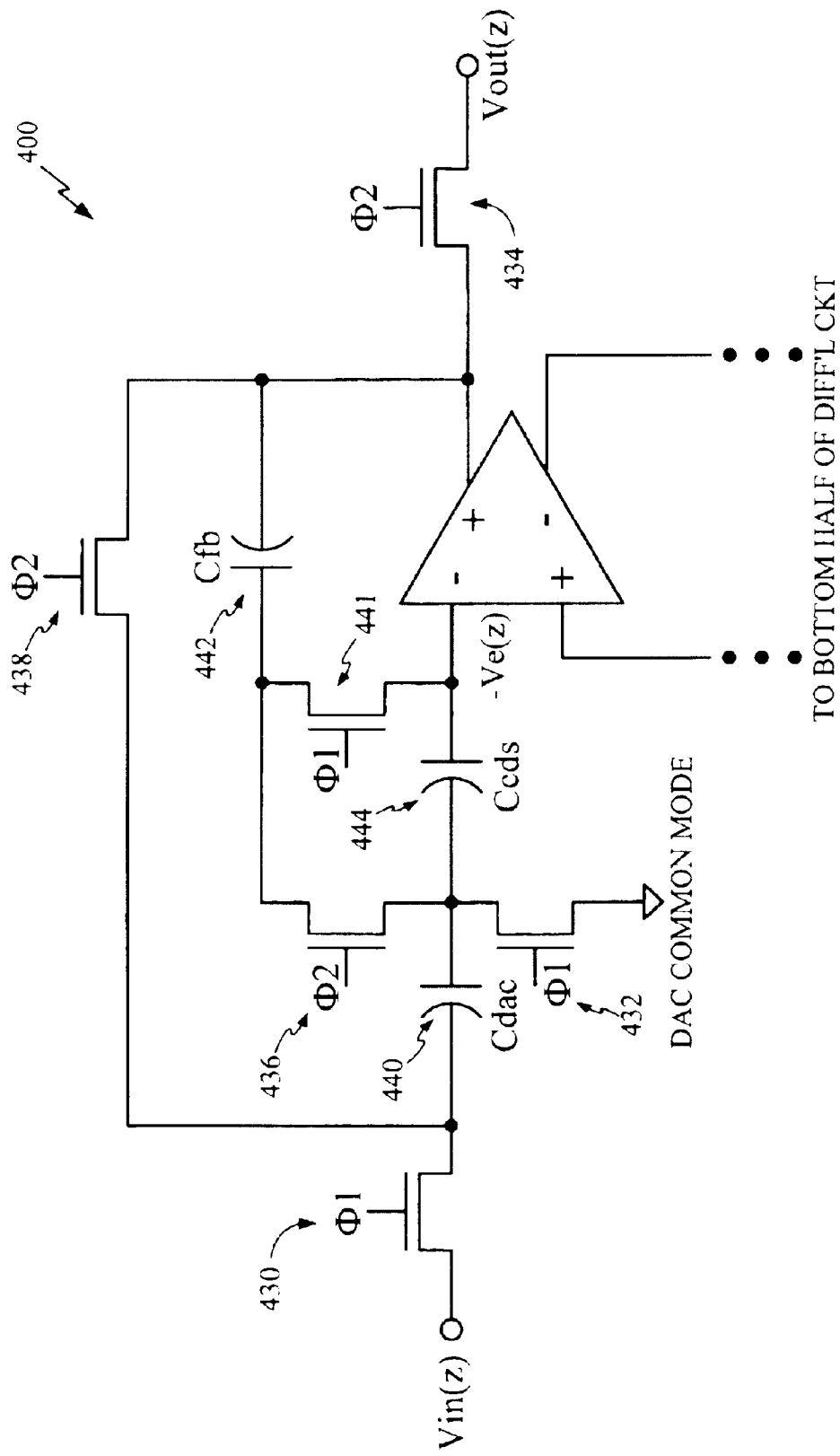
FIG. 4A: FIRST-ORDER DCT FILTER BLOCK WITH CDS

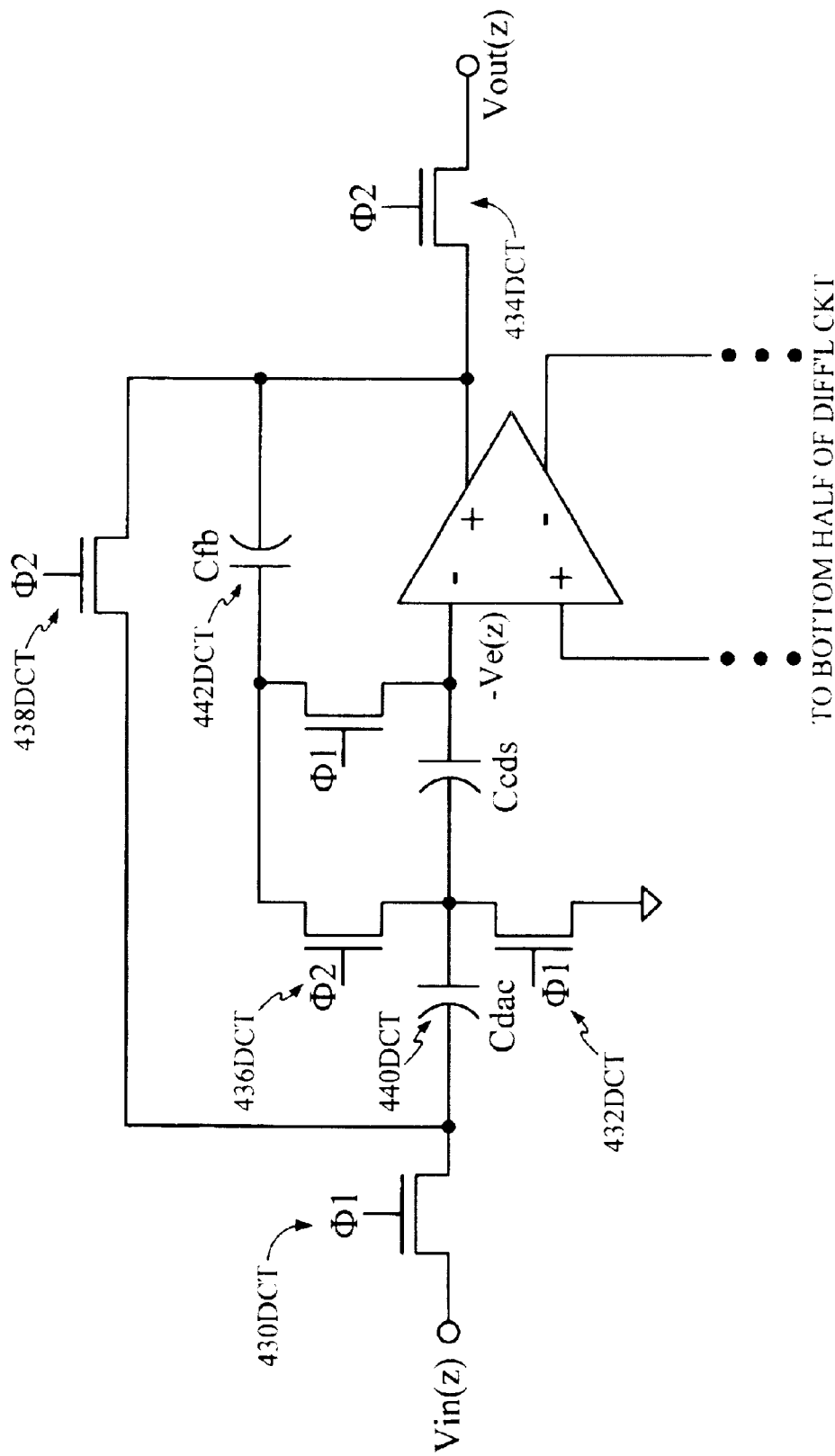
FIG. 4B: FIRST-ORDER DCT FILTER BLOCK WITH CDS

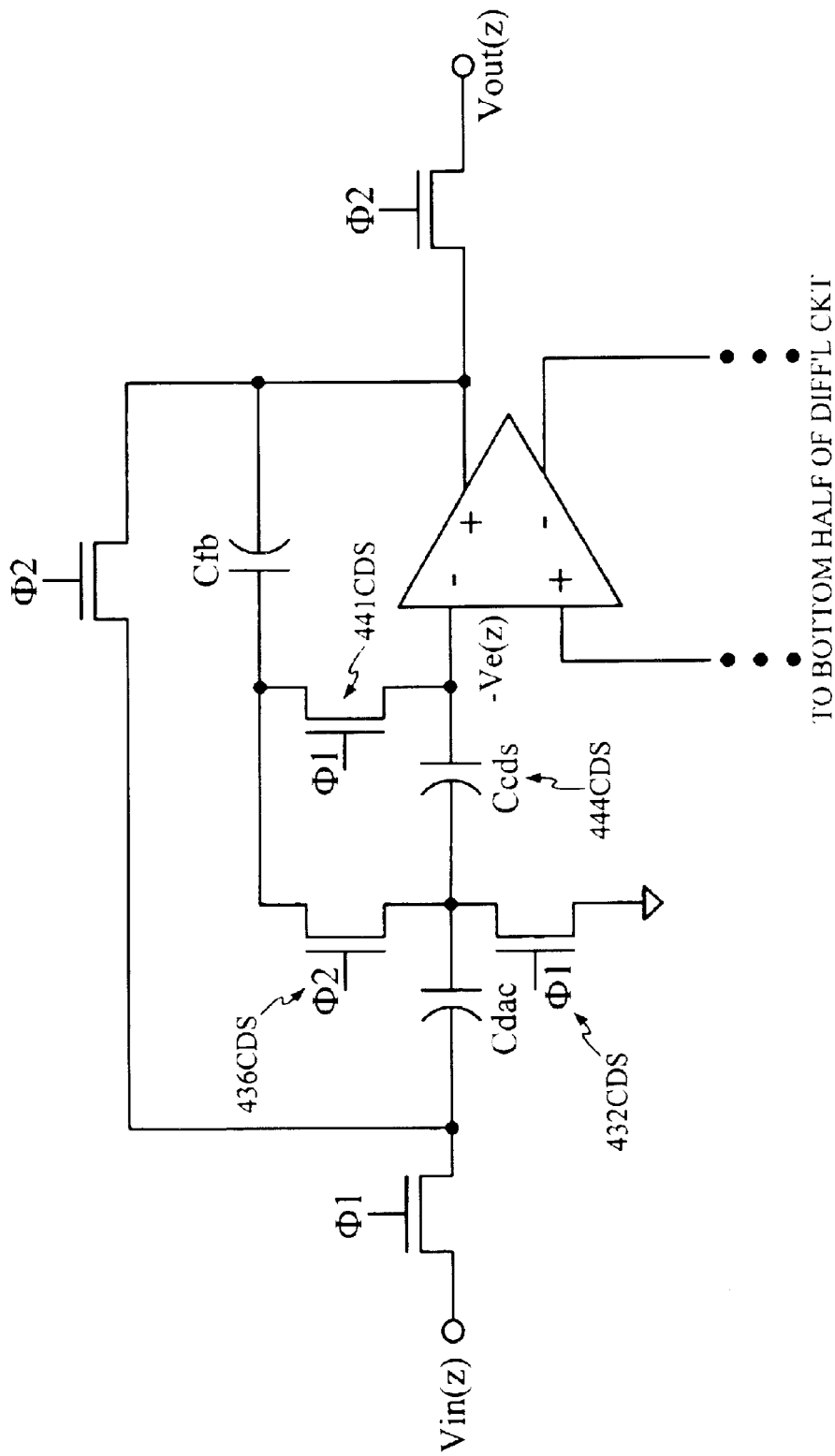
FIG. 4C: FIRST-ORDER DCT FILTER BLOCK WITH CDS

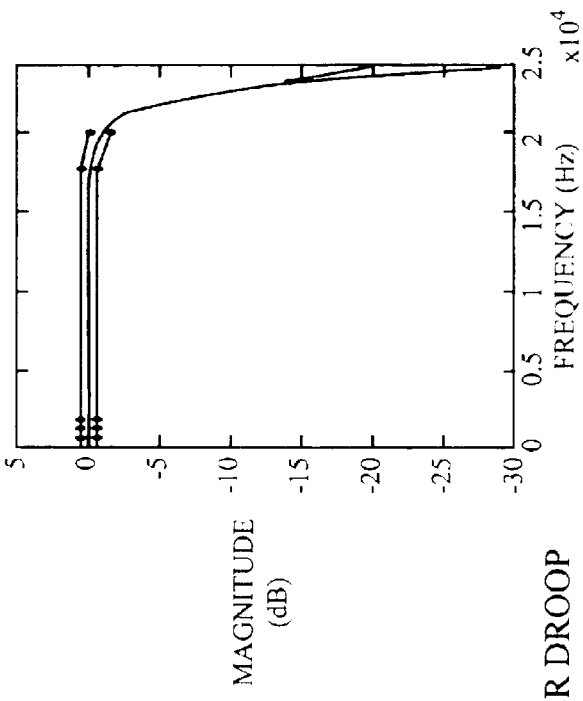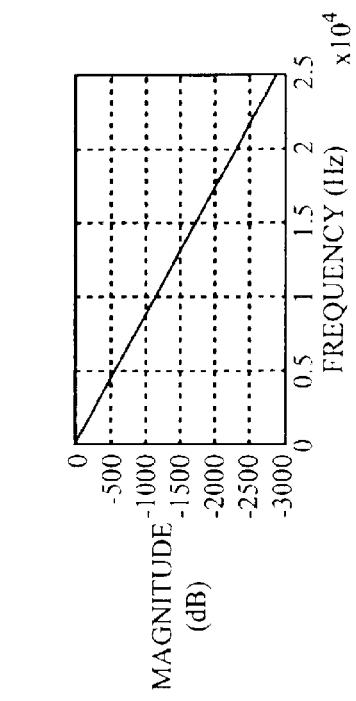
FIG. 6D — RECEIVE CHAIN SPECTRAL AUTHENTICATION SPECIFICATION COMPLIANCE
FIG. 6C — POSTFILTER DROOP COMPENSATION
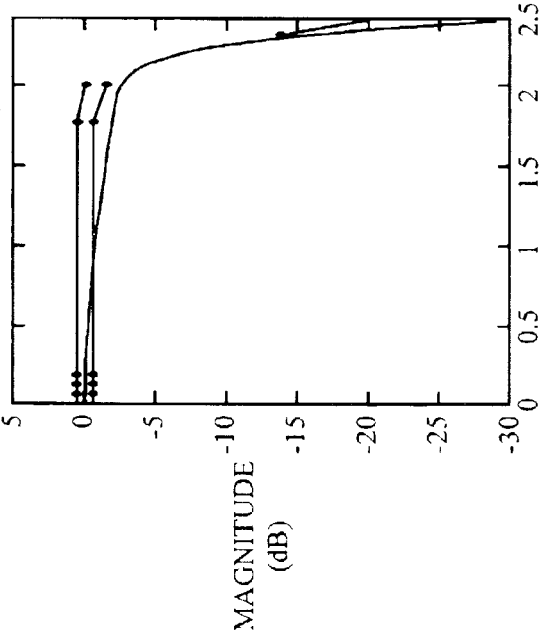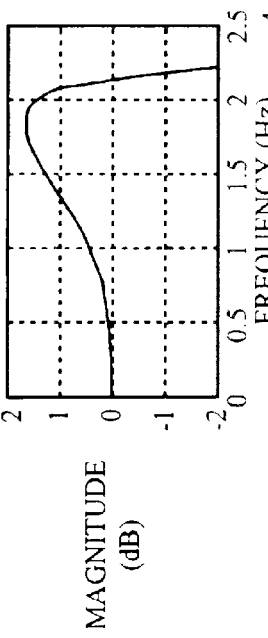
FIG. 6A — RECEIVE CHAIN SPECTRAL AUTHENTICATION SPECIFICATION NON-COMPLIANCE
FIG. 6B — FREQUENCY RESPONSE OF PASSBAND DROOP COMPENSATION FILTER

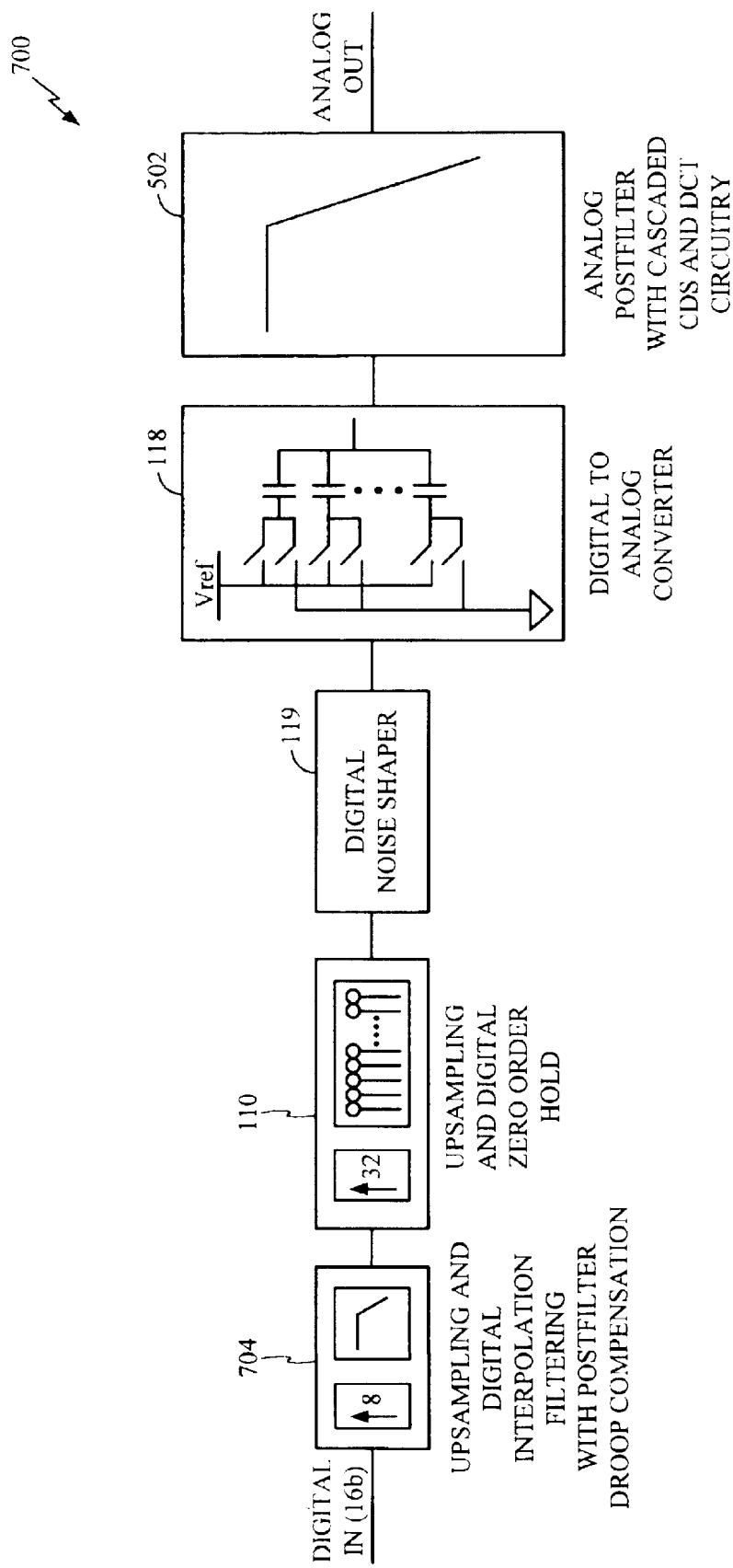
FIG. 7: BLOCK DIAGRAM OF PROPOSED DIGITAL-TO-ANALOG CONVERTER CHAIN

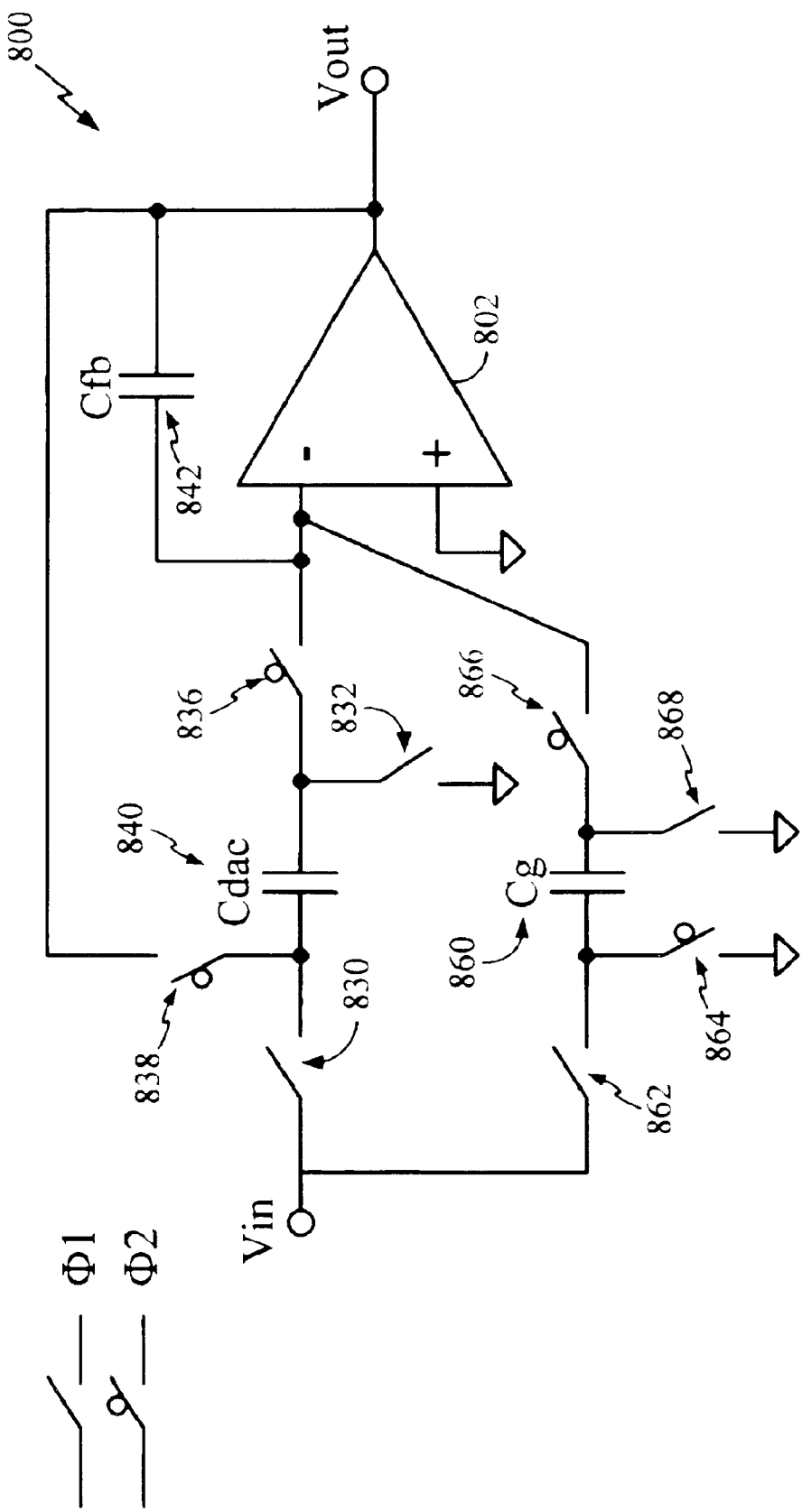
FIG. 8A: DCT WITH GAIN ENHANCMENT

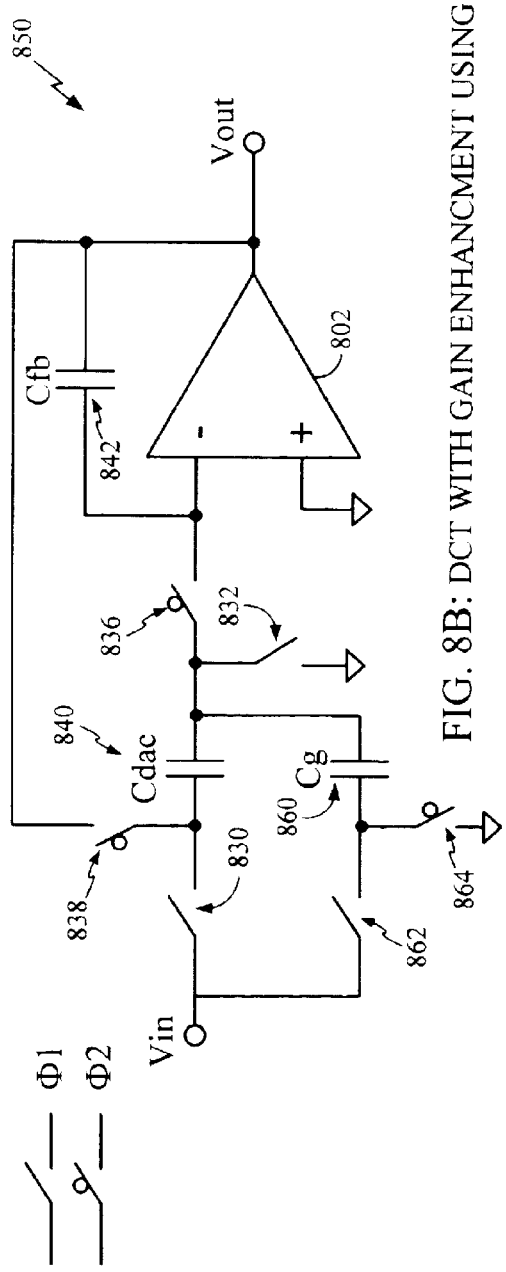
FIG. 8B: DCT WITH GAIN ENHANCMENT USING SWITCH SHARING
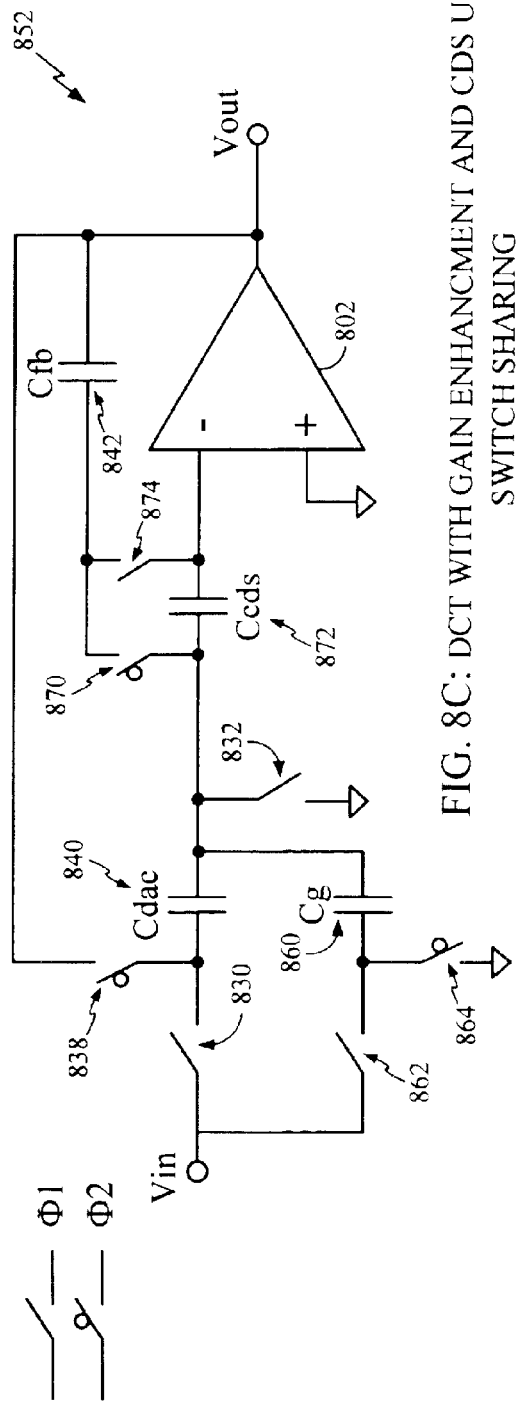
FIG. 8C: DCT WITH GAIN ENHANCMENT AND CDS USING SWITCH SHARING

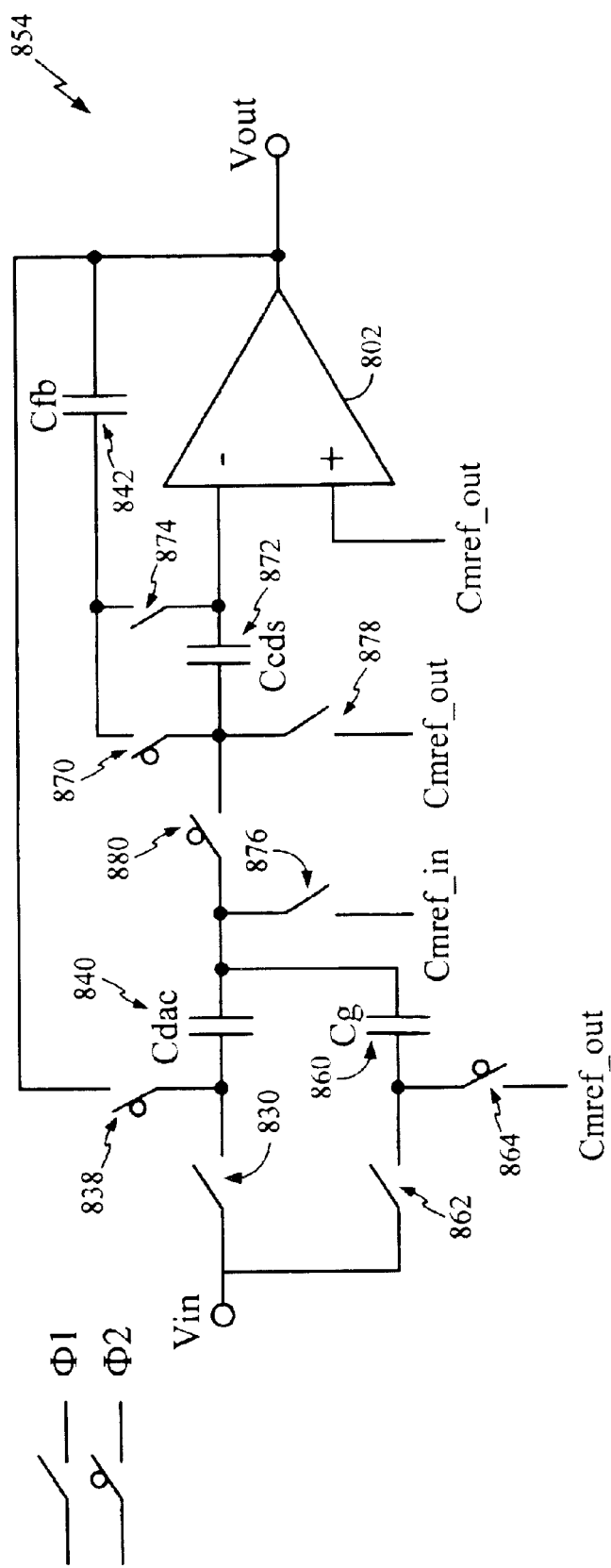
FIG. 8D: DCT WITH CDS, GAIN ENHANCMENT, SWITCH SHARING, AND DUAL COMMON MODE REFERENCE

DIGITAL TO ANALOG CONVERTER AUGMENTED WITH DIRECT CHARGE TRANSFER TECHNIQUES

RELATED APPLICATIONS

This application claims priority to U.S. Provisional Application No. 60/392,363 filed Jun. 27, 2002.

BACKGROUND

1. Technical Field

The present application relates, in general, to digital to analog converters.

2. Description of the Related Art

Digital to analog converters (hereafter referred to as "DACs") attempt to produce a faithful reproduction of an analog continuous-time signal from discrete-time digital samples. In theory, a DAC can be implemented with an array of weighted analog components that are controlled by an incoming digital code. The outputs of the weighted analog components are then summed and filtered to reproduce a continuous-time signal.

One type of DAC is known in the art as an "oversampling" DAC. One example of an oversampling DAC device is shown in FIG. 1.

FIG. 1 shows related-art oversampling DAC device 100. Upsampling and digital interpolation filtering unit 104, composed of 8× upsampling unit 106 and digital interpolation filtering unit 108, receives the digital input signal. In operation, 8× upsampling unit 106 typically samples much faster than the rate at which the digital input signal is expected to change, and tends to create unwanted spectral images. Accordingly, digital interpolation filtering unit 108 receives the output of 8× upsampling unit 106 and removes the unwanted spectral images created by the operation of 8× upsampling unit 106.

Upsampling and digital zero order hold unit 110, composed of 32× upsampling unit 112 and digital zero order hold filtering unit 114 receives the output of digital interpolation filtering unit 108. In particular, 32× upsampling unit 112 receives the output of digital interpolation filtering unit 108. Digital zero order hold filtering unit 114 receives the output of 32× upsampling unit 112, and typically repeats an incoming sample for a number of times equal to the amount of upsampling (e.g., repeating 32 times).

The output of digital zero order hold filtering unit 114 feeds to digital noise shaping loop 119. Digital noise shaping loop 119 contains embedded quantizer unit 117 which typically reduces the number of elements required to perform the actual digital to analog conversion (e.g., such as those illustrated in DAC 118). Digital noise shaping loop 119 typically functions to push much of the digital quantization noise introduced by the quantization operation out of the signal band of interest and provides a high pass noise transfer function. The input to digital noise shaping loop 119 typically sees unity gain to the output of digital noise shaping loop 119, so signals of interest are generally not degraded by the operation of digital noise shaping loop 119.

The output of digital noise shaping loop 119 controls the switching of the actual DAC elements of DAC 118. In some cases, the designer may also choose to add element linearization circuitry which is controlled by the output of the digital noise shaping loop 119 and in turn dictates the switching of the actual DAC elements of DAC 118, such that the resulting output of the DAC array is unaffected by mismatches between the DAC elements. The actual DAC elements of DAC 118 typically deliver either charge or current to a summing node in order to produce a reconstructed analog signal.

The output of DAC 118 is received by analog postfilter 120. Generally, analog postfilter 120 is configured to reduce the out-of-band noise resulting from shaped quantization performed by digital noise shaper 116. Those having ordinary skill in the art will appreciate that, for a fully monolithic integrated circuit application, it is desirable that analog postfilter 120 be of at least the order of digital noise shaping loop 119 in order to attenuate out-of-band noise. Having analog postfilter 120 be at least the same order as noise shaping loop 119 helps prevent interference of out of band noise with other circuit blocks on a monolithic chip, and also avoids undesirable mixing with other out-of-band signals.

In modern integrated circuit (e.g., CMOS) processes, the digital circuitry used in upsampling, noise shaping, and analog postfiltering of the actual DAC element switching can be scaled down to the point where power and area consumption are very low for a given noise specification. However, the analog performance of such scaled down systems is often limited by inherent component noise, which has generally not been reduced as integrated circuit (e.g., CMOS) process resolution has increased. In response to this dilemma, related-art circuit techniques have been developed to reduce noise and power consumption. However, notwithstanding these related art techniques, a more or less constant need exists in the art for D/A techniques which reduce noise and power consumption, especially in scaled down monolithic integrated circuit applications.

In addition to the foregoing, there are additional problems associated with D/A converters having differing input (digital) and output (analog) common mode references. This problem originates from the fact that system designers typically assume that their negative references for both digital and analog components are the same—namely 0V. System designers do this because 0V is a convenient reference and it provides them with the maximum signal swing for a given positive reference. Analog reference voltages should typically be from rail-to-rail, that is from 0V to the maximum supply voltage, because the analog output swing must be as wide as possible. However, system designers have recognized that the negative digital reference does not necessarily need to be at 0V. The negative digital reference may be set higher so as to make the digital common mode the same as the analog common mode. In this case, system designers have recognized that the common mode references for the digital and analog need not be split, and in fact, for DCT (described following), the common mode references may be set to a value independent of the actual digital/analog common mode.

The drawback to this approach in D/A converter designs such as where a DCT postfilter is integrated with a D/A converter, however, is that by decreasing the difference between the positive and negative reference voltages, the amplitude of the signal that comes into the analog postfilter is also decreased. Since the noise of the analog postfilter is the same as before, the signal-to-noise ratio is now in turn decreased. In order to restore the signal-to-noise ratio, the power and area of the analog postfilter must increase to reduce the noise. Thus, the split-common mode reference scheme is preferred because the amplitude of the signal incoming to the analog postfilter need not be decreased. However, the split common mode reference scheme does cause problems as outlined above. Accordingly, a need exists for a scheme that will utilize a split common mode reference, while alleviating some of the problems associated with the scheme.

BRIEF SUMMARY

In one embodiment, an electronic system includes but is not limited to a digital to analog converter (DAC) having a DAC output; and an analog postfilter having a postfilter input coupled to the DAC output, said analog postfilter including a first direct charge transfer (DCT) coupled filter having a first DCT coupled filter input and a first DCT coupled filter output a second DCT coupled filter having a second DCT coupled filter input operably connected with the first DCT coupled filter output.

In one embodiment, a method for use with an electronic system includes but is not limited to coupling a digital to analog converter (DAC) output with an analog post filter having a first direct charge transfer (DCT) coupled filter and a second DCT coupled filter.

In one embodiment, a method for use with an electronic system includes but is not limited to filtering a digital to analog converter (DAC) output signal with an analog post filter having a first direct charge transfer (DCT) coupled filter and a second DCT coupled filter.

In one embodiment, an electronic system includes but is not limited to a digital to analog converter (DAC) having a DAC output; and an analog postfilter having a postfilter input coupled to the DAC output, said analog postfilter including at least (1) a dual common mode switching network coupled between the DAC output and a first DCT coupled filter input, and (2) a second DCT coupled filter having a second DCT coupled filter input coupled to a first DCT coupled filter output.

In one embodiment, a method for use with an electronic system, said method includes but is not limited to coupling a DAC output with a first direct charge transfer (DCT) coupled filter input wherein said coupling a DAC output with a first direct charge transfer (DCT) coupled filter input includes: (a) coupling a DAC sampling capacitor to a DAC common mode reference with a first switch, (b) coupling the first DCT filter input to an analog common mode reference with a second switch, and (c) said first switch and second switch controllable such that the DAC sampling capacitor is couplable to the first DCT filter input shortly after at least one of decoupling the DAC sampling capacitor from the DAC common mode reference and decoupling the first DCT coupled filter input from the analog common mode reference [FIG. 5]; and coupling a first DCT coupled filter output with a second DCT coupled filter input.

In one embodiment, a method for use with an electronic system includes but is not limited to compensating for a difference between a digital common mode reference voltage and an analog common mode reference voltage by coupling a Digital to Analog Converter (DAC) to the digital common mode reference voltage and coupling an analog portion to the analog common mode reference voltage at a first time and coupling at least a portion of the DAC with the analog portion at a second time; filtering a DAC output signal with a first direct charge transfer (DCT) coupled filter; and filtering an output of the DCT coupled filter with a second direct charge transfer (DCT) coupled filter.

The foregoing is a summary and thus contains, by necessity, simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined solely by the claims, will become apparent in the non-limiting detailed description set forth herein.

BRIEF DESCRIPTION OF THE SEVERAL VIEWS OF THE DRAWINGS

FIG. 1 shows a related-art oversampling DAC device.

FIG. 2A depicts the switching and logic of a DCT coupled filter.

FIG. 2B illustrates an implementation of circuitry of a DCT coupled filter.

FIG. 3A depicts the switching and logic of inverting switched-capacitor circuitry employing the CDS technique.

FIG. 3B illustrates an implementation of inverting switched-capacitor circuitry wherein the CDS technique is achieved.

FIGS. 4A, 4B, and 4C illustrate circuitry of a DCT coupled filter augmented with a CDS switching matrix (circuitry that performs a CDS operation).

FIG. 4B shows the circuitry of FIG. 4A, wherein those switches and components which provide a DCT coupled filter analogous to the DCT coupled filter of FIG. 2B are noted.

FIG. 4C depicts the circuitry of FIG. 4A, wherein those switches and components which augment the operation of the DCT coupled filter by the CDS technique are noted.

FIGS. 6A–6D respectively show illustrations of the magnitude response of an analog postfilter wherein passband droop is present (FIG. 6A), magnitude (FIG. 6B) and phase (FIG. 6C) responses of one implementation of postfilter droop compensation filter logic which corrects passband droop, and a magnitude response of an analog postfilter wherein an implementation of postfilter droop compensation filter logic has functioned such that passband droop is no longer present (FIG. 6D).

FIG. 7 shows a DAC architecture, which is similar to the DAC architecture shown and described in FIG. 1, but which has been modified from FIG. 1 to incorporate subject matter shown and described herein.

FIG. 8A illustrates an implementation of the circuitry of a DCT coupled filter having gain enhancement.

FIG. 8B illustrates an implementation of DCT coupled filter having gain enhancement, where the implementation uses switch sharing.

FIG. 8C illustrates an implementation of the circuitry of a DCT coupled filter having gain enhancement and a CDS switching matrix, where the implementation uses switch sharing.

FIG. 8D illustrates an implementation of the circuitry of a DCT coupled filter having gain enhancement, a CDS switching matrix, and a dual common mode reference where the implementation uses switch sharing.

The use of the same symbols in different drawings typically indicates similar or identical items.

DETAILED DESCRIPTION

I. Introduction

Figure 5:
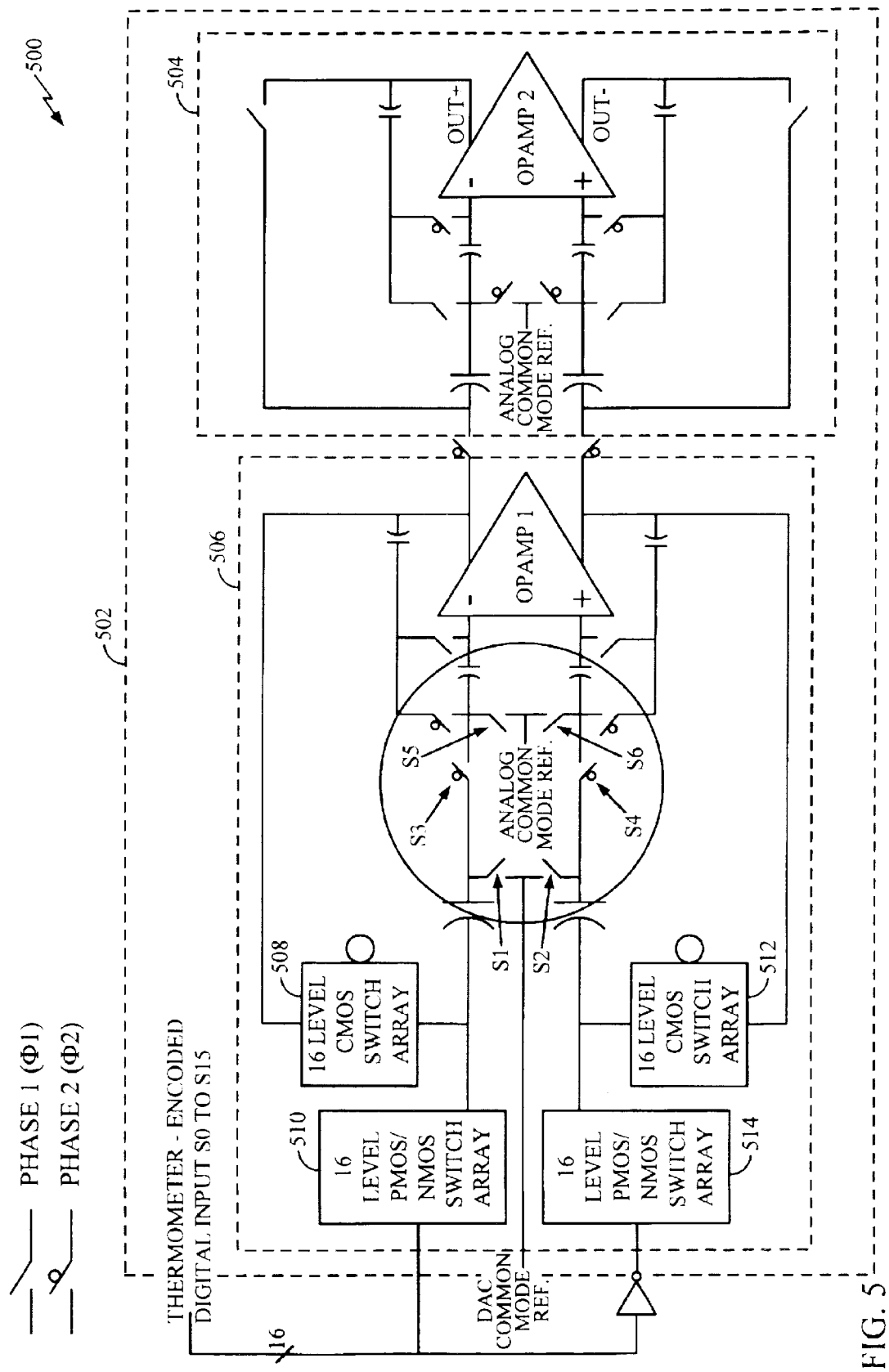
FIG. 5 shows a DAC system having analog postfilters composed of cascades of DCT coupled filters augmented by CDS and dual common mode switching matrices.

In one embodiment, improved D/A conversion is provided by use of devices and processes that utilize Direct Charge Transfer (DCT) coupled filtering. In another embodiment, D/A conversion is yet further improved by augmenting the DCT coupled filtering devices and processes with Correlated Double Sampling (CDS) circuitry and processes. In yet another embodiment, D/A conversion is yet further improved by augmenting the DCT filtering devices and processes with postfilter droop compensation circuitry and processes.

II. D/A Devices and Processes Having DCT Coupled Filter Blocks

A. DCT Coupled Filter Blocks

One disadvantage of switched-capacitor D/A topologies is the undesirable tradeoff between kT/C noise, capacitor area, and power dissipation. One circuit process that decouples the power dissipation factor from this tradeoff is referred to herein as Direct Charge Transfer (DCT) coupled filtering.

FIGS. 2A and 2B show two different schematic diagrams of direct charge transfer (DCT) coupled filter 200. As depicted below, the circuitry illustrated in FIGS. 2A and 2B can be shown to have a transfer function representative of a first-order filtering operation in discrete time; consequently, the circuitry depicted in FIGS. 2A and 2B is referred to herein as a "DCT coupled filter." FIG. 2A depicts the switching and logic of DCT coupled filter 200. FIG. 2B illustrates an implementation of the circuitry of DCT coupled filter 200.

FIG. 2A shows the switching and logic of DCT coupled filter 200. During a first phase of operation $\Phi 1$, switch 230 is closed and hence the filter input terminal Vin(z) is connected to a first terminal of sampling capacitor Cdac 240 (e.g., a sampling capacitor of a digital to analog converter (DAC) as shown and described below). Also during the first phase of operation $\Phi 1$, switch 232 is closed and switch 236 is open, so the second terminal of the sampling capacitor Cdac 240 is connected to ground. During the first phase of operation $\Phi 1$, wherein the sampling capacitor Cdac 240 is acquiring charge, both switch 236 and 238 are open, so both operational amplifier (opamp) 202 and the feedback capacitor Cfb 242 are decoupled from the sampling capacitor Cdac 240. Consequently, during the first phase of operation $\Phi 1$, the sampling capacitor Cdac 240 does not appear as a load to opamp 202. In addition, during the first phase of operation $\Phi 1$, switch 234 is open.

During a second phase of operation $\Phi 2$, switch 230 is open and hence the first terminal of the sampling capacitor Cdac 240 has been decoupled from the filter input terminal Vin(z) and instead coupled with the operational amplifier 202 output. Also during the second phase of operation $\Phi 2$, switch 232 is open and switch 236 is closed, so the second terminal of the sampling capacitor Cdac 240 has been decoupled from ground and instead coupled with the feedback capacitor Cfb 242. In addition, during the second phase of operation $\Phi 2$, switch 234 is closed.

The DCT logic and switching shown in FIG. 2A realize a first-order filter transfer function, while avoiding connection of sampling capacitance in a configuration in which opamp 202 sees the aggregate capacitance as a load through the feedback network. Specifically, when DCT coupled filter 200 is analyzed, the analysis reveals that DCT coupled filter 200 has a transfer function of:

$$Vout(z)/Vin(z) = z^{-1/2}/((1+Cfb/Cdac)-(Cfb/Cdac)*z^{-1})$$

which those skilled in the art will appreciate is representative of a first-order filtering operation in discrete time. Consequently, circuitry depicted in FIGS. 2A and 2B is referred to herein as a "DCT coupled filter" 200 having a filter input terminal Vin(z) and a filter output terminal Vout(z).

Unlike traditional RC-equivalent switched-capacitor networks in which an opamp (e.g., opamp 202) supplies a charging current for an integrating capacitor (e.g., feedback capacitor Cfb), in DCT coupled filter 200 of FIGS. 2A and 2B, during the second phase of operation $\Phi 2$ the sampling capacitor Cdac 240 connects in parallel with the integrating capacitance Cfb, passively sharing the input charge. Consequently, opamp 202 of DCT coupled filter 200 is now only tasked to drive the bottom-plate capacitance of the feedback capacitor, which is negligible in many modern wafer processes that offer metal-insulator-metal capacitors. Those skilled in the art will appreciate that this technique can save a substantial amount of power.

FIG. 2B illustrates one implementation of the circuitry of DCT coupled filter 200. In FIG. 2B the switches 230, 232, 234, 236, and 238 shown in FIG. 2A are implemented by transistors. The switches of FIG. 2B operate in the same fashion as their like-numbered counterparts of FIG. 2A. Switches described herein may be implemented as NMOS, PMOS, or a parallel combination of one NMOS and one PMOS transistor.

B. DCT Coupled Filter Having CDS Switching Matrix

In one embodiment of the subject matter of the present application, if the circuitry of DCT coupled filter 200 is augmented with what will be referred to herein as a correlated double sampling (CDS) technique switching matrix, DCT coupled filter 200 can be utilized even in applications that are highly noise sensitive. As an aid to understanding, prior to describing the DCT coupled filter augmented by the CDS switching matrix circuitry, the CDS technique will first be discussed in isolation.

1. CDS Technique

The CDS technique can be viewed as an autozeroing technique that can be used to eliminate opamp offset and finite opamp gain effects in switched-capacitor circuits. Why this is so will become apparent below.

FIGS. 3A and 3B show two different schematic diagrams of inverting switched-capacitor circuitry 300 which illustrate the correlated double sampling (CDS) technique. Although inverting switched-capacitor circuitry 300 of FIGS. 3A and 3B may appear superficially similar to other circuitry described elsewhere herein, the circuitry of FIGS. 3A and 3B is different than that circuitry shown elsewhere herein.

FIG. 3A shows inverting switched-capacitor circuitry 300 depicting the switching and logic of the CDS technique. During a second phase of operation $\Phi 2$, both switches 332 and 341 are closed and hence a first terminal of the correlated double sampling capacitor Ccds 344 is coupled to ground and a second terminal of the correlated double sampling capacitor Ccds 344 is coupled to both the negative input of opamp 320 and the feedback capacitor Cfb 342. This coupling allows the difference between error voltage Ve, at the negative input of opamp 320, and ground to be stored, or sampled, on the correlated double sampling capacitor Ccds 344. During a first phase of operation $\Phi 1$, switches 330, 334, and 336 are closed and switches 335, 332, and 341 are open. Hence, during the first phase of operation $\Phi 1$, wherein Vin is coupled to the sampling capacitor Cdac and wherein the integrator composed of Cfb and opamp 320 integrates, the low frequency components of Ve will not have changed much, resulting in the terminal of Ccds 344 opposite the opamp acting as a modified virtual ground 350 from which the low frequency components of Ve at the op-amp virtual ground 348 have been cancelled out. Heuristically, the foregoing described operation can be understood as follows: during the second phase of operation $\Phi 2$, the charge on correlated double sampling capacitor Ccds 344 will interact with the charge on feedback capacitor Cfb 342 such that on the next integrating phase of the two-clock waveform $\Phi 1$ in this case), the voltage on the feedback capacitor voltage Cfb 342 has been adjusted such that the error voltage of the operational amplifier, Ve(z), will effectively be "cancelled out," so that the overall interaction will be "as if" the operational amplifier 320 were operating with substantially no error voltage. Hence, the CDS technique automatically "zeros out" the functioning of the overall operational amplifier technique, which is why CDS is referred to in the art as an "autozeroing" technique. With respect to inverting switched-capacitor circuitry 300, Vout (z) may be derived as follows:

$$V\text{out}(z)=(-(Cdac/Cfb)*V\text{in}(z)/(1-z^{-1}))-((1+(Cdac/Cfb))*(Ve(1-z^{-1/2}))/(1-z^{-1})).$$

FIG. 3B illustrates one implementation of inverting switched-capacitor circuitry 300 wherein the CDS technique is achieved. In FIG. 3B the switches 330, 332, 334, 335, 336, and 341 shown in FIG. 3A are implemented by transistors. The switches of FIG. 3B operate in the same fashion as their like-numbered counterparts of FIG. 3A.

When inverting switched-capacitor circuitry 300 is analyzed, the analysis shows the transfer function of the error voltage Ve to the output is as follows (note that the cancellation is described in relation to the integrating phase of the two-clock waveform Φ1 as described in relation to FIGS. 3A and 3b)). First, as described above, Vout(z) may be derived as follows:

$$V\text{out}(z)=(-(Cdac/Cfb)*V\text{in}(z)/(1-z^{-1}))-((1+(Cdac/Cfb))*(Ve(1-z^{-1/2}))/(1-z^{-1})).$$

Then, noting that:
Ve(n)=Vos+Vnoise(n)+(Vout(n)/A), where A is the low-frequency gain of the operating amplifier, rearranging terms and taking the Z-transform yields a transfer function of the error voltage Ve to the output is as follows $$V\text{outerror}(z)=(1+Cdac/Cfb)*(V\text{noise}(1-z^{-(1/2)}))+(V\text{out}/A)*(1-z^{-(1/2)}),$$

which is representative of a first-order differentiation operation performed on the input-referred opamp noise voltage, as well as the finite-gain effects of opamp 320, thereby increasing the effective DC gain of the integrator. That is, since, as has been described, the dominant portions of Ve change relatively slowly, the differentiation produced by the CDS technique tends to significantly reduce the input-referred opamp noise voltage. Consequently, as seen from the foregoing, the CDS technique may be utilized to reduce the op-amp input-referred 1/f noise, in applications where such noise is a problem. The 1/f noise is concentrated at low frequency and is in fact one dominant portion of Ve of concern.

2. DCT Coupled Filter Augmented with CDS Switching Matrix

FIGS. 4A, 4B, and 4C illustrate circuitry 400 of a DCT coupled filter augmented with a CDS switching matrix (circuitry that performs a CDS operation). The circuitry 400 of FIG. 4A includes switches 430, 432, 434, 436, 438, and 441. The switches are illustrated as transistors. The circuitry 400 also includes capacitors Cdac 440, Ccds 444, and Cfb 442. Because the circuitry 400 of FIGS. 4A, 4B, and 4C achieves both DCT and CDS techniques, and because some of the circuitry serves "double duty" as both DCT and CDS circuitry, it is easier to discuss each "aspect" of the circuitry of FIG. 4A in isolation.

FIG. 4B shows the circuitry of FIG. 4A, wherein those switches and components which provide a DCT coupled filter analogous to DCT coupled filter 200 of FIG. 2B are noted. Specifically, comparison of the circuitry of FIG. 4B with the circuitry of DCT coupled filter 200 depicted in FIG. 2B shows those switches and components which provide the DCT capability. Those switches are labeled in FIG. 4B as switches and components having reference numerals ending in "DCT". The switches and components that provide the DCT capability function analogously to the like components shown and described in relation to FIGS. 2A and 2B.

FIG. 4C depicts the circuitry of FIG. 4A, wherein those switches and components which augment the operation of the DCT coupled filter by the CDS technique are noted. Specifically, comparison of the circuitry of FIG. 4C with the CDS circuitry depicted and described in relation to FIG. 3B shows those switches and components which provide the CDS autozeroing. Those switches and components are labeled in FIG. 4C as switches and components having reference numerals ending in "CDS". Those skilled in the art will appreciate that the respective phases of the CDS circuitry shown in FIG. 4C are notated as the reverse of the similar functioning switches in FIG. 3B. The switches and components that provide the CDS capability function analogously to the like components shown and described in relation to FIGS. 3A and 3B, and are not be explicitly re-described here for sake of brevity C. Analog Postfilter Composed of Cascaded DCT Coupled Filters An analog postfilter of a DAC should preferably be of at least the order of the quantization noise shaping utilized by a digital noise shaper to attenuate out of band noise. In many applications, this shaping is second order. Accordingly, as has been shown above, insofar as that DCT coupled filter 200 provides a first order filtering transfer function, DCT coupled filter 200, in the absence of the subject matter of the present application, has historically not been recognized as viable for use as a complete analog postfilter. However, in one implementation of the subject matter described herein, DCT coupled filter 200 is utilized to create second order, or higher, filters by using cascaded DCT coupled filters 200.

1. Second Order Analog Postfilter

FIG. 5 shows a DAC system 500 having analog postfilters composed of cascades of DCT coupled filters augmented by CDS switching matrices. Second order analog postfilter 502 is representative of substantially all analog postfilters in FIG. 7. Second order analog postfilter 502 is composed of a cascade of DCT coupled filter augmented by CDS switching matrix 504 and DCT coupled filter augmented by CDS switching matrix 506. Comparison of the circuitry of the individual DCT coupled filters augmented by CDS switching matrices 504, 506 with the circuitry shown and described in relation to FIGS. 4A, 4B, and 4C shows that such individual DCT coupled filters augmented by CDS switching matrices are substantially analogous to the circuitry 400 shown and described in relation to FIGS. 4A, 4B, and 4C. DCT coupled filter augmented by CDS switching matrix 506 is shown having a dual common mode switch matrix" circuitry (discussed below), which is optional in one implementation. In DCT coupled filter augmented by CDS switching matrix 506, certain switches are shown as being part of 16 level switch arrays 508, 510, 512, and 514. With respect to the functioning of the Φ1 and Φ2 switch notation, the notation of at least some of the circuitry in FIG. 5 has been reversed from such notation as used in FIGS. 4A, 4B, and 4C. Following such reversal in notation is well within the ambit of one having ordinary skill in the art, especially in light of this explanatory note. The functioning of the CDS switching matrix 504 in cascade with DCT coupled filter augmented by CDS switching matrix 506 will not be explicitly described here. Understanding such functioning of the cascaded circuits can be understood in light of the discussion of the circuitry of FIGS. 4A, 4B, and 4C, above.

It is to be understood that, although DCT coupled filters augmented by CDS switching matrices are shown and described in relation to FIG. 5, in some implementations DCT coupled filters 400 can be cascaded in the absence of the CDS switching matrices (e.g., via use of DCT coupled filters 200). That is, in some noise-tolerant applications DCT coupled filters 200 function sufficiently well that the CDS switching matrices augmentations of such cascaded filters are not utilized in such applications. With respect to of FIG. 5, Opamp2 does not have a switched output. This is due to the fact that Opamp2 is used to drive continuous time (analog) circuitry.

It has been discovered that in many applications, the foregoing described cascaded DCT coupled filters work well, and that the foregoing described cascaded DCT coupled augmented by the CDS switching matrices work even better. However, it has also been discovered that in certain other applications, such as DACs implemented in monolithic integrated circuits, the performance of such cascaded DCT coupled filters augmented by the CDS switching matrices can be improved. Specifically, the performance can be improved by providing circuitry that allows the common mode voltage used by a DAC to be significantly different than the common mode voltage used by an operational amplifier circuit within the same integrated circuit, or within a monolithic integrated circuit. This circuitry, devised to alleviate the discovered common mode implementation difficulty, will be referred to herein as "dual common mode switch matrix" circuitry.

D. Dual Common Mode Switch Matrix Circuitry Coupling DAC With Analog Postfilter

FIG. 5 depicts encircled on the schematic, switches that function as dual common mode switch matrix circuitry that separates the common mode reference voltage of the DAC from the common mode reference voltage of the operational amplifier circuitry. On a first phase Φ1 of operation, switches S1 and S2 connect the bottom nodes of the DAC sampling capacitors Cdac to the DAC common mode reference, while switches S5 and S6 connect the CDS capacitors Ccds to the opamp common mode voltage reference. Thus, during the first phase Φ1 of operation, switches S3 and S4 are open, thereby separating the DAC common mode reference from the opamp common mode voltage reference.

On phase Φ2 of operation, the DAC sampling capacitors Cdac and the CDS capacitors Ccds are disconnected from their respective reference voltages and are thereafter connected through switches S3 and S4 to realize the DCT charge-sharing operation shown and described above.

E. Postfilter Droop Compensation of Analog Postfilter Composed of Cascaded DCT Coupled Filters When the foregoing cascaded DCT coupled filters augmented by the CDS and dual common mode switching matrices were implemented, it was discovered that in most applications such circuitry functions exceptionally well. However, it was also discovered that, in certain other applications, such as audio applications, the performance can be improved by providing logic that alleviates what will be referred to herein as "passband droop" of the signal emerging from an analog postfilter.

FIG. 6A shows one illustration of the magnitude response of an analog postfilter wherein passband droop is present. As can be seen in FIG. 6A, the term "passband droop" indicates that an analog postfilter does not filter sharply at its cutoff frequencies, but rather rounds off, or "droops," at its cutoff frequencies.

It has been found that in certain applications, such as audio applications, overall performance of systems can be significantly improved by use of "postfilter droop compensation logic," typically located in an upsampling and digital interpolation filtering unit (see FIG. 7). This postfilter droop compensation logic introduces predistortion in the input signal such that the output signal emerging from an analog postfilter does not experience significant postfilter droop.

FIGS. 6B–6C respectively show illustrations of magnitude and phase responses of one implementation of postfilter droop compensation logic. This magnitude and phase responses are empirically or numerically chosen by the system designer to correct passband droop, such as that shown in FIG. 6A.

FIG. 6D shows a magnitude response of the analog postfilter shown and described in relation to FIG. 6A, when an input signal has been subjected to the postfilter droop compensation logic shown and described in relation to FIGS. 6B–C. As can be seen, implementation of postfilter droop compensation filter logic has functioned such that passband droop is no longer present in the output of the analog postfilter.

With reference now to FIG. 7, shown is DAC architecture 700, which is similar to DAC architecture 100 shown and described in FIG. 1, but which has been modified. Specifically, depicted is that analog postfiltering of DAC 118 is now being provided by second order analog postfilter 502, which as shown is similar to the analog postfilters shown and described in relation to FIGS. 4A, 4B, 4C, and 5 above.

Further illustrated is that upsampling and digital interpolation filtering unit 104 has been modified to become upsampling and digital interpolation filtering unit with postfilter droop compensation unit 704, which now contains postfilter droop compensation logic. Essentially, this postfilter droop compensation logic "pre-distorts" the digital input signal such that, when the ultimate output signal emerges from analog postfilter 700, the passband droop is no longer present (e.g., as illustrated in FIG. 6D). Postfilter droop compensation logic may be implemented via any one of various "pre-distortion" techniques well known to those having ordinary skill in the art.

The implementations, discussed above, described use of a DCT coupled filter having unity gain. In other implementations, other gains are employed. For example, FIGS. 8A–8D illustrate such alternate implementations, which are not described exhaustively for sake of brevity.

FIG. 8A shows a DCT coupled filter 800 that has gain enhancement circuitry. During a first phase of operation Φ1, switches 830, 832, 862, and 868 are closed. During a second phase of operation Φ2, the switches 836, 838, 864, and 866 are closed. The functioning of the various components of the DCT coupled filter 800 may be understood by comparison with analogous components, discussed at length above.

FIG. 8B shows a DCT coupled filter 850 that has gain enhancement circuitry that uses switch sharing. During a first phase of operation Φ1, switches 830, 832, and 862 are closed. During a second phase of operation Φ2, the switches 836, 838, and 864 are closed. The functioning of the various components of the DCT coupled filter 850 may be understood by comparison with analogous components, discussed at length above.

FIG. 8C shows a DCT coupled filter 852 that has gain enhancement circuitry that uses both switch sharing and the CDS technique. During a first phase of operation Φ1, switches 830, 832, 862, and 874 are closed. During a second phase of operation Φ2, the switches 838, 864, and 870 are closed. The functioning of the various components of the DCT coupled filter 852 may be understood by comparison with analogous components, discussed at length above.

FIG. 8D shows a DCT coupled filter 854 that has gain enhancement circuitry that uses switch sharing, the CDS technique, and the dual common mode reference technique. During a first phase of operation Φ1, switches 830, 862, 874, 876, and 878 are closed. During a second phase of operation Φ2, the switches 838, 864, 870, and 880 are closed. The functioning of the various components of the DCT coupled filter 854 may be understood by comparison with analogous components, discussed at length above.

FIG. 8A illustrates an implementation of the circuitry of a DCT coupled filter having gain enhancement. Inspection of the charge transfer within the circuit of FIG. 8A reveals that, in the Z-domain, the circuit transfer function can be derived as follows:

$$(Cfb/+Cdac)\cdot \text{Vout}(z) = Cfb\cdot \text{Vout}(z)\cdot z^{-1} + (Cdac+Cg)\cdot \text{Vin}(z)$$

$$\frac{\text{Vout}(z)}{\text{Vin}(z)} = \frac{\left(1+\frac{Cg}{Cdac}\right)}{\left(\left(1+\frac{Cfb}{Cdac}\right)-\frac{Cfb}{Cdac}\cdot z^{-1}\right)}$$

The DC gain of the circuit is non-unity; however, this increase in flexibility is obtained at the cost of an additional loading capacitor which will require the opamp power dissipation to increase as Cg increases. Analysis shows that the switched-capacitor noise of this setup is similar to the original DCT case described above. Other transfer functions for the filters shown in FIGS. 8B–8D can be likewise derived using circuit analysis techniques.

Those having ordinary skill in the art will recognize that the state of the art has progressed to the point where there is little distinction left between hardware and software implementations of aspects of systems; the use of hardware or software is generally, but not always, a design choice representing cost vs. efficiency tradeoffs. Those having ordinary skill in the art will appreciate that there are various vehicles by which aspects of processes and/or systems described herein can be effected (e.g., hardware, software, and/or firmware), and that the preferred vehicle will vary with the context in which the processes and/or systems are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which aspects of the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The foregoing detailed description has set forth various embodiments of the devices and/or processes via the use of block diagrams, flowcharts, and examples. Insofar as such block diagrams, flowcharts, and examples contain one or more functions and/or operations, it will be understood that each function and/or operation within such block diagrams, flowcharts, or examples can be implemented, individually and/or collectively, by a wide range of hardware, software, firmware, or virtually any combination thereof. In one embodiment, the present invention may be implemented via Application Specific Integrated Circuits (ASICs). However, those skilled in the art will recognize that the embodiments disclosed herein, in whole or in part, can be equivalently implemented in standard Integrated Circuits, as one or more computer programs running on one or more computers (e.g., as one or more programs running on one or more computer systems), as one or more programs running on one or more controllers (e.g., microcontrollers) as one or more programs running on one or more processors (e.g., microprocessors, or digital signal processors), as firmware, or as virtually any combination thereof, and that designing the circuitry and/or writing the code for the software and or firmware would be well within the skill of one of ordinary skill in the art in light of this disclosure. In addition, those skilled in the art will appreciate that the mechanisms of the present invention are capable of being distributed as a program product in a variety of forms, and that an illustrative embodiment of the present invention applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various embodiments described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into systems which are typically partly analog and partly digital. That is, the devices and/or processes described herein can be integrated into analog and partly digital systems via a reasonable amount of experimentation well within the ambit of those having an ordinary amount of skill in the art. In particular, while the subject matter of the present application has been described herein in the context of an audio application, those having ordinary skill in art will appreciate that the subject matter described herein. For example, the subject matter described herein may be usefully employed in mobile communications devices (e.g., wireless phones, pagers, personal computers, embedded computers, and the like), fixed communications devices (e.g., wireless base stations and land line communications systems such as optical or electrical LANS, WANS, analog communications, analog networks and the like), recording devices (e.g., video or audio recording devices and the like), computational devices (e.g., computing systems such as personal, mini, workstation, and mainframe computing systems and the like), and sensing devices (e.g., infrared, ultraviolet, radio frequency, microwave sensing devices and the like).

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An electronic system comprising:
    a digital to analog converter (DAC) having a DAC output;
    and an analog postfilter having a postfilter input coupled to the DAC output, said analog postfilter including a first direct charge transfer (DCT) coupled filter having a first DCT coupled filter input and a first DCT coupled filter output and a second DCT coupled filter having a second DCT coupled filter input operably connected with the first DCT coupled filter output, wherein said analog postfilter having a postfilter input coupled to the DAC output further comprises:
    a dual common mode switching matrix interposed between the DAC output and the first DCT coupled filter input.

2. The electronic system of claim 1, wherein said dual common mode switching matrix interposed between the DAC output and the first DCT coupled filter input further comprises:
    a first switch interposed between a node of a DAC sampling capacitor and a DAC common mode reference;
    a second switch interposed between the node of the DAC sampling capacitor and an operational amplifier input; and
    a third switch interposed between the operational amplifier input and analog common mode reference.

3. The electronic system of claim 2, further comprising:
    a correlated double sampling (CDS) capacitor interposed between at least one of said second switch and said third switch and the operational amplifier input.

4. The electronic system of claim 2, further comprising:
    at a first time,
    said first switch closed,
    said second switch open, and
    said third switch closed.

5. The electronic system of claim 2, further comprising:
    at a second time,
    said first switch open,
    said second switch closed, and
    said third switch open.

6. The electronic system of claim 1, wherein the first direct charge transfer (DCT) coupled filter comprises:
    correlated double sampling (CDS) circuitry.

7. The electronic system of claim 1, wherein the second DCT coupled filter further comprises:
    correlated double sampling (CDS) filter circuitry.

8. The electronic system of claim 1, further comprising:
    a digital interpolation filter with postfilter droop compensation.

9. The electronic system of claim 1, wherein said electronic system comprises at least one of a mobile communications device, a recording device, a computational device, and a sensing device.

10. The electronic system of claim 1, further comprising:
    a monolithic integrated circuit having said digital to analog converter (DAC) and said analog postfilter.

11. A method for use with an electronic system, said method comprising:
    coupling a digital to analog converter (DAC) output with an analog post filter having a first direct charge transfer (DCT) coupled filter and a second DCT coupled filter wherein, said analog postfilter further comprises:
    a dual common mode switching matrix interposed between the DAC output and the first DCT coupled filter input.

12. The method of claim 11, wherein said coupling a digital to analog converter (DAC) output with an analog post filter having a first direct charge transfer (DCT) coupled filter and a second DCT coupled filter comprises:

coupling a DAC sampling capacitor to a DAC common mode reference;

coupling a first operational amplifier input to an analog common mode reference; and coupling the DAC sampling capacitor to the first operational amplifier input shortly after at least one of decoupling the sampling capacitor from the DAC common mode reference and decoupling the first operational amplifier input from the analog common mode reference.

13. The method of claim 12, further comprising:

coupling an output of the first DCT coupled filter with an input of the second DCT coupled filter.

14. The method of claim 12, wherein said coupling the DAC sampling capacitor to the first operational amplifier input shortly after at least one of decoupling the sampling capacitor from the DAC common mode reference and decoupling the first operational amplifier input from the analog common mode reference further comprises:

coupling the DAC sampling capacitor to the first operational amplifier input through a correlated double sampling (CDS) capacitor.

15. The method of claim 11, further comprising:

coupling the digital to analog converter (DAC) output with the analog post filter in a monolithic integrated circuit.

16. The method of claim 11, further comprising:

coupling a DAC input with a postfilter droop compensator.

17. A method for use with an electronic system, said method comprising:

filtering a digital to analog converter (DAC) output signal with an analog post filter having a first direct charge transfer (DCT) coupled filter and a second DCT coupled filter, wherein said analog postfilter further comprises:

a dual common mode switching matrix interposed between an output of the DAC and an input of the first DCT coupled filter.

18. The method of claim 17, wherein said filtering a digital to analog converter (DAC) output signal with an analog post filter having a first direct charge transfer (DCT) filter and a second DCT coupled filter comprises:

filtering the DAC output signal with the first DCT coupled filter; and filtering an output of the first DCT coupled filter with the second DCT coupled filter.

19. The method of claim 18, wherein said filtering the DAC output signal with the first direct charge transfer (DCT) filter further comprises:

performing correlated double sampling (CDS) on a first operational amplifier error signal.

20. The method of claim 18, wherein said filtering an output of the first DCT coupled filter with a second DCT coupled filter further comprises:

performing correlated double sampling (CDS) on a second operational amplifier error signal.

21. The method of claim 17, further comprising:

filtering the digital to analog (DAC) output signal with an analog post filter having a first direct charge transfer (DCT) coupled filter and a second DCT coupled filter in a monolithic integrated circuit.

22. The method of claim 17, further comprising:

compensating a DAC input signal for postfilter droop.

23. An electronic system comprising:

a digital to analog converter (DAC) having a DAC output; and an analog postfilter having a postfilter input coupled to the DAC output, said analog postfilter including at least a dual common mode switching network coupled between the DAC output and a first DCT coupled filter input, and a second DCT coupled filter having a second DCT coupled filter input coupled to a first DCT coupled filter output.

24. The electronic system of claim 23, wherein the dual common mode switching network comprises:

a first switch interposed between a node of a sampling capacitor and a DAC common mode reference;

a second switch interposed between the node of the sampling capacitor and an operational amplifier input; and a third switch interposed between the operational amplifier input and an analog common mode reference.

25. The electronic system of claim 24, further comprising:

a correlated double sampling (CDS) capacitor interposed between at least one of the second switch and the third switch and the operational amplifier input.

26. The electronic system of claim 23, further comprising a single integrated circuit having said digital to analog converter (DAC), the first DCT coupled filter, and said second DCT coupled filter.

27. The electronic system of claim 23, wherein the electronic system comprises at least one of a mobile communications device, a recording device, a computational device, and a sensing device.

28. A method for use with an electronic system, said method comprising:

coupling a DAC output with a first direct charge transfer (DCT) coupled filter input wherein said coupling a DAC output with a first direct charge transfer (DCT) coupled filter input includes:

coupling a DAC sampling capacitor to a DAC common mode reference with a first switch, coupling the first DCT coupled filter input to an analog common mode reference with a second switch, and the first switch and the second switch controllable such that the DAC sampling capacitor is couplable to the first DCT coupled filter input shortly after at least one of decoupling the DAC sampling capacitor from the DAC common mode reference and decoupling the first DCT coupled filter input from the analog common mode reference; and coupling a first DCT coupled filter output with a second DCT coupled filter input.

29. The method of claim 28, further comprising:

manufacturing a monolithic integrated circuit having the DAC output coupled with the first direct charge transfer (DCT) coupled filter input and the first DCT coupled filter output coupled with the second DCT coupled filter input in a single integrated circuit.

30. The method of claim 28, further comprising:

coupling a DAC input with a postfilter droop compensator.

31. A method for use with an electronic system, said method comprising:

compensating for a difference between a digital common mode reference voltage and an analog common mode reference voltage by coupling a Digital to Analog Converter (DAC) to the digital common mode reference voltage and coupling an analog portion to the analog common mode reference voltage at a first time and coupling at least a portion of the DAC with the analog portion at a second time;

filtering a DAC output signal with a first direct charge transfer (DCT) coupled filter; and filtering an output of the DCT coupled filter with a second direct charge transfer (DCT) coupled filter.

32. The method of claim 31, further comprising:

filtering the DAC output signal with the first direct charge transfer (DCT) coupled filter and filtering the output of the DCT coupled filter with the second direct charge transfer (DCT) coupled filter in a single integrated circuit.

33. The method of claim 31, further comprising:

compensating a DAC input signal for postfilter droop.

34. An electronic system comprising:

a digital to analog converter (DAC) having a DAC output; and an analog postfilter having a postfilter input coupled to the DAC output, said analog postfilter including at least a dual common mode switching network coupled between the DAC output and a first DCT coupled filter input.

35. The electronic system of 34 further comprising:

a second DCT coupled filter having a second DCT coupled filter input coupled to a first DCT coupled filter output.

* * * * *